United States Patent [19]
Alelyunas et al.

[11] Patent Number: 5,705,949
[45] Date of Patent: Jan. 6, 1998

[54] COMPENSATION METHOD FOR I/Q CHANNEL IMBALANCE ERRORS

[75] Inventors: Carl H. Alelyunas; Andrew L. Norrell, both of Nevada City, Calif.; Vladimir Parizhsky, Chicago, Ill.

[73] Assignee: U.S. Robotics Access Corp., Lincolnshire, Ill.

[21] Appl. No.: 712,927

[22] Filed: Sep. 13, 1996

[51] Int. Cl.[6] .................................................. H03D 3/00
[52] U.S. Cl. .......................... 329/304; 329/318; 329/341; 375/349
[58] Field of Search ....................... 329/304–310, 329/315, 318–321, 341–343; 375/317, 324, 346, 349, 350

[56] References Cited

U.S. PATENT DOCUMENTS

| | | |
|---|---|---|
| 4,783,660 | 11/1988 | Pierce . |
| 5,111,155 | 5/1992 | Keate et al. . |
| 5,231,364 | 7/1993 | Mucke . |
| 5,301,210 | 4/1994 | Vandamme et al. ............... 329/304 X |
| 5,321,726 | 6/1994 | Kafadar . |
| 5,339,040 | 8/1994 | Loper . |
| 5,351,016 | 9/1994 | Dent . |
| 5,371,481 | 12/1994 | Tittanen et al. . |
| 5,420,536 | 5/1995 | Faulkner et al. . |

*Primary Examiner*—David Mis
*Attorney, Agent, or Firm*—McDonnell Boehnen Hulbert & Berghoff

[57] ABSTRACT

A method in which correctable I/Q imbalance errors in a complex receiver can be detected and compensated for digitally without the use of special calibration signals. Differential D.C. offset errors are compensated by averaging the incoming $I_d$ and $Q_d$ digital signals and subtracting from them an expected value of differential D.C. offset, for example, computed from the long term average of the I and Q signals to create I' and Q' signals. Differential gain imbalance errors are corrected by calculating a root means square average of the I' and Q' digital signals and applies to them compensation coefficients $K_x$ and $K_y$ determined from either the RMS average or from a Stochastic Gradient Algorithm. The DSP compensates for the quadrature phase errors by calculating a compensation matrix which is independent of the frequency of the carrier and applies the compensation matrix to the I' and Q' digital signals. The compensation matrix for quadrature phase errors is completely independent of the frequency of the input carrier signal supplied to the complex receiver, and is not dependent on the use of a calibration signal. The compensation may be performed as a step in calibration of the complex receiver, or continuously.

26 Claims, 1 Drawing Sheet

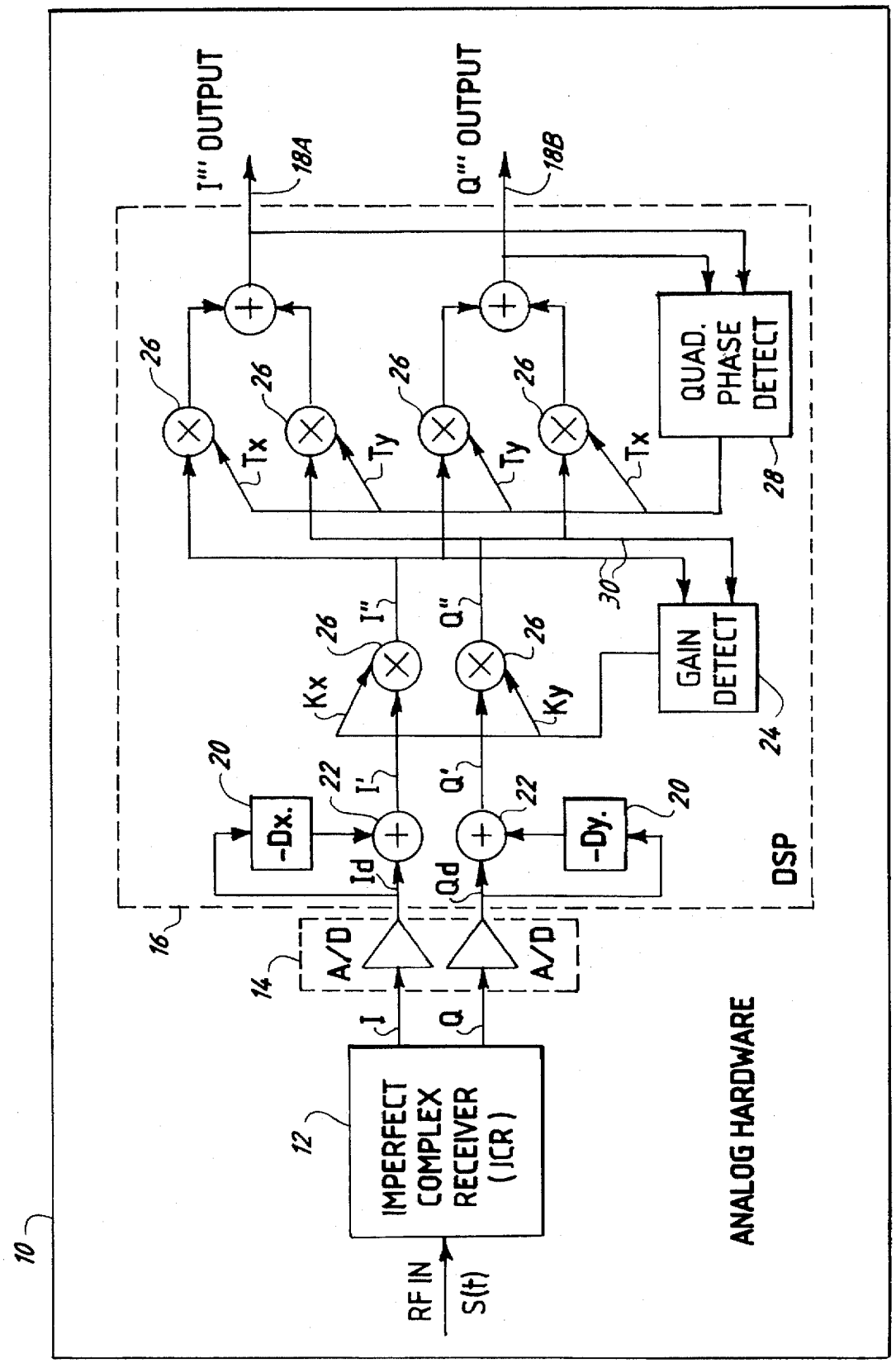

COMPENSATION METHOD FOR I/Q CHANNEL IMBALANCE ERRORS

BACKGROUND OF THE INVENTION

A. Field of the invention

This invention relates generally to the field of telecommunication systems, and more particularly to receivers for such systems that generate in-phase (I) and 90 degree out-of-phase or quadrature (Q) signal components in response to the receipt of an incoming carrier signal. One variety of these types of receivers are known in the art as complex receivers, and are used in a variety of applications, including cellular telephone modems.

B. Statement of Related Art

Complex receivers, sometimes referred to Imperfect Complex Receivers (ICR), are known devices that have internal circuitry which creates I and Q signals in response to the receipt of a single tone carrier signal such as an RF (radio frequency) signal. The I and Q signals may have certain correctable errors. The I and Q signals are nominally in quadrature, that is, separated in phase by 90 degrees. However, the I and Q signals may have differential DC offset, gain, and quadrature phase errors. Detection and correction of such imbalance errors are generally necessary in order to achieve a satisfactory level of performance of a system using the receivers. Specifically, imbalances in the I/Q demodulation process produce imperfections in the recovered signal. Some processing is necessary to get the received information from the I/Q domain, and offset, gain and quadrature phase distortion can be transformed to the non-linear, where it becomes unrecoverable and therefore indistinguishable from noise.

Prior art patents that relate to the general subject of complex transmitters and/or receivers and correction of I/Q imbalance errors include the patent to Kafadar, U.S. Pat. No. 5,321,726. The Kafadar patent describes the calibration of a vector demodulator using a statistical analysis approach. The system described by Kafadar uses a special calibration or reference signal which is applied to a power divider which splits the reference signal into two coherent in-phase and quadrature reference signals. The coherent in-phase and quadrature reference signals are supplied to two mixers, where they are mixed with two equal-power components of a modulated RF signal. The statistical approach envisioned by Kafadar is used for the analysis and correction of the received data. The magnitude of each vector, defined by an (I/Q) pair in a received data signal is examined. If the measured magnitude differs from an expected value, a number of samples of the data signal are used to define a linearly transformed circle. The transformation parameters of this model are then calculated, for example, using a least squares analysis. These parameters are related to the system errors to be corrected (including gain, offset and quadrature errors), and can be used to determine appropriate calibration factors which are employed to adjust the received information and produce actual data values.

Other references include the patents to Tittanen et at, U.S. Pat. No. 5,371,481 and Keate et al., U.S. Pat. No. 5,111,155. The Tittanen et al. patent describes the calibration of a transmitter using a measurement of power output. The Keate et at. reference describes a system that corrects phase dependence on modulation depth, which is a particular impairment to traveling wave tube amplifiers. In the system described in the Keate et at. reference, the matrix transformation of (AI+BQ, AQ−BI) cannot possibly correct for a quadrature error. Further, the description of Keate et al. is particularly directed to transmitters, whereas the present invention is primarily directed to correction of I and Q imbalance errors in receivers. Other background patents include the patents to Dent, U.S. Pat. No. 5,351,016; Mucke, U.S. Pat. No. 5,231,364; Loper, U.S. Pat. No. 5,339,040; and Pierce U.S. Pat. No. 4,783,660, the contents of which are incorporated by reference herein.

In the present invention, I and Q imbalance errors in terms of amplitude, gain and relative phase are detected and corrected for without the need for special calibration signals, which involves additional complexity in the receiver such as described in the above-referenced Kafadar patent. Additionally, the invention provides for detection and compensation for such errors essentially independent of changes in the input carrier signal supplied to the I/Q receiver. For example, in the present invention the correction of errors in the relative phase between I and Q to produce a quadrature phase relationship is independent of the frequency of the incoming signal, or changes in the frequency. Additionally, the present invention lends itself to a implementation with digital signal processing techniques.

The present invention is particularly suitable to cellular telephone or cellular telephone modem systems. The invention is distinct from the prior art in the present invention contemplates complex (I/Q) modulation and demodulation techniques for generating and receiving FM audio signals. Further, the modulation and demodulation is done digitally and mathematically, with a digital signal processor, as opposed to using a number of analog methods. In addition, as rioted above, some processing of the FM signal is necessary to get the received information from the I/Q domain, and offset, gain and quadrature phase distortion can be transformed to the non-linear by the above processing, where it becomes unrecoverable and therefore indistinguishable from noise. In the present invention, the compensation method is performed mathematically in a manner whereby the inversion of errors becomes possible before the aforementioned processing.

SUMMARY OF THE INVENTION

In a communication system, a detection and compensation method is provided for I/Q channel imbalance errors for I and Q analog signals generated by a complex receiver. An analog carrier signal is received by the complex receiver, which then responsively generates the I and Q analog signals in a well known fashion. The I and Q analog signals are nominally separated in phase by 90 degrees and have differential D.C. offset, differential gain imbalance and quadrature phase errors. The quadrature phase error is proportional to a factor $\epsilon$ related to the phase difference between the I and Q analog signals.

In accordance with a preferred form of the invention, the I and Q analog signals are converted to $I_d$ and $Q_d$ digital signals and fed to a digital signal processor that performs the error detection and compensation functions. The DSP compensates for differential D.C. offset errors by averaging the incoming $I_d$ and $Q_d$ digital signals and subtracting from them an expected value of differential D.C. offset, for example, computed from the long term average of the $I_d$ and $Q_d$ signals, to create offset corrected signals I' and Q'. The DSP compensates for the differential gain imbalance errors by calculating a root means square average of the I' and Q' digital signals and applying to them compensation coefficients $K_x$ and $K_y$ determined from this RMS average, or from a Stochastic Gradient Algorithm, to create I" and Q" signals. The DSP compensates for the quadrature phase errors by calculating a compensation matrix which is independent of the frequency of the carrier and applies the compensation matrix to the I" and Q" digital signals. After performing the above compensation functions, the DSP generates I'" and Q'" output signals which include compensation for the differential offset, differential gain and quadrature phase errors.

BRIEF DESCRIPTION OF THE DRAWING

In the following description, reference will be made to the appended drawing FIGURE, which, shows a block diagram of a preferred digital signal processing compensator arrangement for a complex receiver that takes I and Q signals, detects and compensates for gain, offset and quadrature errors in the I and Q signals, and generates substantially error-free I'" and Q'" output signals.

DETAILED DESCRIPTION OF THE PREFERRED EMBODIMENT

Generally, the invention contemplates a method by which correctable I/Q imbalance errors in a complex receiver can be detected and compensated for without the use of special calibration signals. A preferred implementation of the invention is shown in the FIGURE. The system 10 includes a complex receiver 12 which receives an analog radio frequency (RF) carrier input signal represented by the function S(t), and generates I and Q analog output signal in a manner well known in the art. The I and Q output signals from the complex receiver are converted to digital signals by an A/D converter 14, and are then supplied to a digital signal processor (DSP) referred to herein as a "compensator" 16. After compensation within the compensator 16, and referring to the far right portion of the illustration, the compensator 16 outputs digital I'" and Q'" signals on output busses 18A and 18B for subsequent use and processing by the DSP 16, or other circuitry in a manner well known in the art.

In the FIGURE, in one possible embodiment of the invention the complex receiver 12 and compensator 16 are incorporated into a cell phone, or, alternatively, a cell-phone modem. The system 10 uses complex (I/Q) modulation and demodulation techniques for generating and receiving frequency modulated or FM signals. Preferably, the modulating and demodulating is done mathematically, using the DSP compensator 16, as opposed to analog methods.

There are three primary sources of I and Q imbalances in the I and Q analog signals from the complex receiver 12: differential DC offset, differential gain imbalance and quadrature phase errors. Preferably, a capability of correction of all three types of errors is provided for in the compensator 16. Whether, at any one instant, all three types of imbalances are being corrected for (instead of just one or two types of imbalances) depends upon their magnitude, and on the ultimate impairment in the received signal that the system 10 can tolerate.

Imbalances in the I/Q demodulation process produces imperfections in the recovered I and Q signals. Some processing is necessary to get the received information from the I/Q domain, and offset, gain and quadrature phase distortion can be transformed to the non-linear, where it becomes indistinguishable from noise. For example, in the present embodiment and as described below in greater detail, for some modulation schemes we need to apply an FM discriminator mathematically: Audio=arctan $(Q_n/I_n)$- arctan $(Q_{n-1}/I_{n-1})$. The inversion of the errors then becomes impossible, since the problem is reduced from two degrees of freedom to only one.

Referring again to the FIGURE, an incoming FM RF signal on the input of a complex receiver can be represented mathematically in the DSP compensator 16 as follows:

$$s(t)=G\cos(\omega_c t+\psi(t))+N(t) \tag{1}$$

where $\omega_c$ is a carrier of RF signal, G is an amplitude, $\phi(t)$ is information bearing phase, and N(t) is Additive White Gaussian Noise (AWGN).

The imperfect complex receiver 12 removes the carrier and converts the signal S(t) into a complex signal with two components I and Q in a well known manner. I is an in-phase, or real, component, and Q is a quadrature, or imaginary component, as follows:

$$\binom{I}{Q}=\frac{G}{\sqrt{2}}\binom{\cos(\phi(t))}{\sin(\phi(t))}+\binom{N_x(t)}{N_y(t)} \tag{2}$$

Here, $N_x(t)$ and $N_y(t)$ are in-phase and quadrature components of AWGN. After receiving $I_d$ and $Q_d$ digital signals for the A/D converter 14, the DSP compensator 16 processes digital signals I' and Q' which can be represented as:

$$\binom{I'}{Q'}=\binom{G_x\cos(\phi(t)+\epsilon)}{G_y\sin(\phi(t)-\epsilon)}+\binom{D_x}{D_y}+\binom{G_xN_x(t)}{G_yN_y(t)} \tag{3}$$

Here, $G_x \neq G_x$ are gain errors, $D_x \neq D_y$ are differential D.C. offset errors, and $\epsilon$ is a measure of the quadrature phase error.

Differential DC offset errors can be detected by measuring or computing the average of the incoming signals and subtracting the expected values of the differential D.C. offsets ($D_x$ and $D_y$) from $I_d$ and $Q_d$ respectively. The expected values could, for example, be derived from the long term average of the $I_d$ and $Q_d$ signals individually, which are computed and stored in a memory for the DSP 16, and applying compensation to those channels individually by subtracting the long term average from the current (i.e., present) $I_d$ and $Q_d$ signals. These operations are represented by the averaging blocks 20, and the summation function 22 of the output from the averaging block 20 with the input digital $I_d$ and $Q_d$ signals, as shown in FIG. 1.

Gain errors may be removed by averaging the root mean square (RMS) value (or, equivalently, the absolute value of I' and Q' separately), and finding two expected values $K_x$ and $K_y$:

$$K_x=\frac{G}{\sqrt{2}\ G_x}\ ,\ K_y=\frac{G}{\sqrt{2}\ G_y} \tag{4}$$

The gain errors are corrected by multiplying I' and Q' by $K_x$ and $K_y$, respectively.

To determine the expected values $K_x$ and $K_y$ in the gain detection function 24, we prefer to use the Stochastic Gradient Algorithm. The method is derived by first forming a non-negative error functional $\delta^2(K_x, K_y)$:

$$\delta^2(K_x,K_y)=(I'^2+Q'^2-G^2)^2 \tag{5}$$

where $I''=K_xI'$ and $Q''=K_yQ'$ (i.e., the gain corrected values of $I_d$ and $Q_d$). Now, the values of $K_x$ and $K_y$ are updated in the gain detector module 24 according to:

$$K_x=K_x-\alpha\frac{d}{dK_x}\ \delta^2(K_x,K_y) \tag{6}$$

-continued $$K_y = K_y - \alpha \frac{d}{dK_y} \delta^2(K_x,K_y)$$

where α is a number less than one, and d/dK is a differential operator. After substituting (5) into (6), one arrives at the final result:

$$K_x = K_x - \alpha\delta(K_x,K_y)I''$$
$$K_y = K_y - E\delta(K_x,K_y)Q'' \qquad (7)$$

These compensations performed by the gain detector block 24 in the DSP compensator 16 may be made as a calibration step using a specific reference carrier, or, in the case of a complex FM receiver, for example in a cell phone or a cell phone modem, continually adjusting the $K_x$ and $K_y$ compensation factors according to the Stochastic Gradient Algorithm (3). This operation of determining $K_x$ and $K_y$ is indicated by the gain detector block 24 and the multiplication function 26 in FIG. 1. In FIG. 1, the feedback for the gain compensation can come from the intermediate signals I'' and Q'' (as shown by reference numeral 30), or it could come from the finout output signals I''' and Q''' signals.

The quadrature phase error detection and compensation will now be discussed. Preferably, the quadrature phase error detection and compensation is performed by a quadrature phase detector module 28 after the gain and offset compensation has already been performed on the I'' and Q'' signals, as illustrated in the FIGURE.

After the gain and offset compensation errors have been compensated for, the I'' and Q'' signals may be represented by the following equations:

$$\begin{pmatrix} I'' \\ Q'' \end{pmatrix} = \begin{pmatrix} \cos(\phi(t)+\epsilon) \\ \sin(\phi(t)-\epsilon) \end{pmatrix} + \begin{pmatrix} N_x(t) \\ N_y(t) \end{pmatrix} \qquad (8)$$

where again φ is the frequency of the information signal component of S(t) received by the complex receiver 12, ε represents a measure of the quadrature phase error between I and Q, and $N_x(t)$ and $N_y(t)$ are in-phase and quadrature components of AWGN. We also assume for the sake of simplicity in (8) that the gain G is equal to the square root of 2. Expanding the cosine and sine arguments in (8), we get:

$$\begin{pmatrix} I'' \\ Q'' \end{pmatrix} = \begin{pmatrix} \cos\epsilon, -\sin\epsilon \\ -\sin\epsilon, \cos\epsilon \end{pmatrix} \begin{pmatrix} \cos(\phi(t)) \\ \sin(\phi(t)) \end{pmatrix} + \begin{pmatrix} N_x(t) \\ N_y(t) \end{pmatrix} \qquad (9)$$

By finding the inverse of the ε matrix in (9) we calculate a compensation matrix:

$$\begin{pmatrix} \cos\epsilon, -\sin\epsilon \\ -\sin\epsilon, \cos\epsilon \end{pmatrix}^{-1} = \frac{1}{\cos^2\epsilon - \sin^2\epsilon} \begin{pmatrix} \cos\epsilon, \sin\epsilon \\ \sin\epsilon, \cos\epsilon \end{pmatrix} \qquad (10)$$

By multiplying the incoming signal by the inverse or compensation matrix (i.e., the right hand side of equation (10)), we finally have computed I''' and Q''' signals that are orthogonal (i.e., in quadrature relationship) in time.

To determine the magnitude of the quadrature compensation values in the compensation matrix (10), using the same values for I'' and Q'' as above in (8), one must still calculate ε. One method is to calculate the sum of the squares of I'' and Q'' as follows:

$$I''^2 + Q''^2 = 1 - \sin(2\psi(t))\sin(2\epsilon) + N(t,\epsilon) \qquad (11)$$

Physically, the arsine of the absolute magnitude residue from D.C. on the sum-of-squares of I'' and Q'' is, on average, twice the quadrature error ε between I'' and Q'', and may be used as an argument in the compensation matrix (10) values. If φ(t) and noise values N(t,e) are sufficiently random we can determine ε from (11). Since the process of detection and compensation are completely independent of the carrier frequency, $\omega_c$, the process may be used in an FM system (such as a cell phone or a cell phone modem) continuously.

Other methods of detecting quadrature I/Q error are also contemplated. For example, the phase of the I and/or Q signals may be shifted using methods such as Hilbert transform FIR to create two signals 180 degrees out of phase and adding the results. The Hilbert transform FIR is a digital filter structure which shifts the phase of a signal over a limited (positive) frequency range. All the information contained in the I signal is also contained in the Q signal, with the Q signal being nominally 90 degrees out of phase from the I signal. When the Q signal is shifted an additional 90 degrees by a Hilbert transformer or by some other method, the two signals will be nominally the same with a phase difference of 180 degrees. After adding the two signals, the resultant residue indicates the magnitude of the phase error of Q with respect to I. The arcsine of the resultant residue may then be used as an argument to the compensation matrix values.

A recursive Stochastic Gradient Algorithm may be used for compensating (inverting) for the matrix of ε in (9) and generating a compensation matrix having entries $T_x$ and $T_y$. The development of the process follows from the desired response of the FM system to be exactly circular in the (I''',Q''') coordinate system, and an error term is extracted which is the deviation from a circle of a fixed reference radius R:

$$\delta^2(T_x,T_y) = (I'''^2 + Q'''^2 - R^2)^2 \qquad (12)$$

where I''' and Q''' are formed by:

$$\begin{pmatrix} I''' \\ Q''' \end{pmatrix} = \begin{pmatrix} T_x T_y \\ T_y T_x \end{pmatrix} \begin{pmatrix} I'' \\ Q'' \end{pmatrix} \qquad (13)$$

Initially $T_x$ and $T_y$ are selected such that $T_x=1$ and $T_y=0$. This makes the matrix (13) a unity matrix. In a calibration mode, these values are also approriate. In a continuous quadrature correction embodiment, the coefficients $T_x$ and $T_y$ may be updated continuously, as follows:

$$T_x = T_x - \alpha \frac{d}{dT_x} \delta^2(T_x,T_y) \qquad (14)$$

$$T_y = T_y - \alpha \frac{d}{dT_y} \delta^2(T_x,T_y)$$

where α is a number less than one, and $d/dT_{x,y}$ is a differential operator. The coefficient α represents a value that is typically determined empirically in the particular system that is employed, and depends on many parameters. The general behavior is that a larger value for α causes faster convergence to the minimum error, whereas a smaller value has greater short term stability.

After substituting (13) into (14) we arrive at the final result of the algorithm:

$$T_x = T_x - \alpha\delta(T_x,T_y)(K'''\cdot I''+Q'''\cdot Q'')$$

$$T_y = T_y - E\delta(T_x,T_y)(I'''\cdot Q''+Q'''\cdot I'') \qquad (15)$$

Again, note that using the Stochastic Gradient Algorithm to compute quadrature correction coefficients using (15), the detection and compensation of quadrature errors is again completely independent of the carrier frequency ω. The process may be used in an FM system, such as a cell phone modem, continuously. In this embodiment, the application of the quadrature correction matrix having coefficients $T_x$, $T_y$ as in (13) (calculated by quadrature phase detector module 28 according to (15)), to the I' and Q' signals is illustrated in the FIGURE. The summed signals of $I_d$ and $Q_d$ after offset, gain and quadrature compensation are represented by the output I''' and Q''' signals on busses 18A and 18B, respectively.

After the DSP compensator 16 compensates for the gain, DC offset and quadrature errors, it may work on them further, for example separating data from the I and Q axes directly, or demodulating the signals into audio through a discrimination process, according to well know techniques in the art.

Persons of skill in the art will appreciate that these and other variations from the preferred embodiment described herein are possible, without departure from the true spirit and scope of the invention. This true spirit and scope is defined by the claims, to be interpreted in light of the foregoing.

We claim:

1. In a communication system, a detection and compensation method for I/Q channel imbalance errors for I and Q analog signals generated by a complex receiver, comprising the steps of:

receiving an incoming analog carrier signal at said complex receiver and responsively generating said I and Q analog signals, said I and Q analog signals nominally separated in phase by 90 degrees and having differential offset, differential gain imbalance and quadrature phase errors, said quadrature phase error proportional to a factor ε related to the phase difference between said I and Q analog signals;

converting said I and Q analog signals to $I_d$ and $Q_d$ digital signals;

compensating for said differential offset errors by averaging the incoming $I_d$ and $Q_d$ digital signals and subtracting from them an expected value values of differential D.C. offset to create offset compensated signals I' and Q';

compensating for said differential gain imbalance errors by calculating a root mean square average of the I' and Q' digital signals and applying to them compensation coefficients $K_x$ and $K_y$ derived from either said root mean square average or a stochastic gradient algorithm to create gain compensated signals I'' and Q'';

compensating for said quadrature phase errors by calculating a quadrature compensation matrix independent of the frequency of the carrier and applying said compensation matrix to said I'' and Q'' signals to generate I''' and Q''' output signals, whereby said I''' and Q''' output signals compensate for said differential offset, differential gain and quadrature phase errors without the use of calibration signals, thereby improving the performance of said communication system.

2. The method of claim 1, wherein said incoming analog carrier signal comprises an RF signal.

3. The method of claim 2, wherein said differential offset and differential gain imbalance errors are compensated as part of calibrating said complex receiver using a specific reference carrier as said input analog carrier signal.

4. The method of claim 1, wherein said incoming analog carrier signal comprises an FM signal.

5. The method of claim 4, wherein said step of compensation of quadrature phase errors is performed substantially continuously.

6. The method of claim 1, wherein said compensation of said quadrature phase errors is performed by applying a stochastic gradient algorithm to said I'' and Q'' signals.

7. In a communication system, a compensation method for I/Q channel quadrature phase errors in I and Q analog signals generated by a complex receiver, comprising the steps of:

receiving an FM analog carrier input signal with said complex receiver and responsively generating I and Q analog signals having a quadrature phase error;

calculating a compensation matrix independent of the frequency of said FM analog carrier input signal and without the use of a calibration signal, said compensation matrix related to said quadrature phase error between said I and Q analog signals; and applying said compensation matrix to said I and Q signals to compensate for said quadrature phase errors present in said I and Q signals to responsively produce I''' and Q''' output signals separated in phase by substantially 90 degrees.

8. The method of claim 7, wherein said I and Q analog signals are converted to $I_d$ and $Q_d$ digital signals and said compensation factor matrix is applied to said $I_d$ and $Q_d$ digital signals.

9. The method of claim 7, wherein the entries in said compensation matrix are calculated according to a stochastic gradient algorithm.

10. The method of claim 7, wherein said compensation matrix entries are determined using a sum-of-squares calculation for I''' and Q'''.

11. The method of claim 7, wherein said quadrature phase compensation is performed to calibrate said complex receiver.

12. The method of claim 7, wherein said quadrature phase errors are corrected continuously by a digital signal processor.

13. The method of claim 10 or claim 11, wherein said quadrature phase compensation is performed in a cellular telephone system.

14. The method of claim 10 or claim 11, wherein said quadrature phase compensation is performed in a cellular telephone modem.

15. A method for detecting gain variations in a complex receiver output, comprising the steps of:

receiving an incoming analog carrier signal at said complex receiver and responsively generating said I and Q analog signals, said I and Q analog signals nominally separated in phase by 90 degrees and having a differential gain imbalance error;

converting said I and Q analog signals to $I_d$ and $Q_d$ digital signals;

compensating for said differential gain imbalance errors by calculating a root mean square average of the $I_d$ and $Q_d$ digital signals and applying to said $I_d$ and $Q_d$ signals compensation coefficients $K_x$ and $K_y$ derived from either a root mean square average of said $I_d$ and $Q_d$ signals or from a stochastic gradient algorithm.

16. The method of claim 15, wherein said incoming analog carrier signal is an FM signal.

17. The method of claim 15, wherein said step of compensation is performed continuously.

18. The method of claim 15, wherein said step of compensation is performed in a digital signal processor.

19. The method of claim 15, wherein said step of compensation is performed as a calibration of said complex receiver.

20. Communication apparatus, comprising:
   a complex receiver for receiving an analog input carrier signal and responsively generating I and Q analog signals;
   means for converting said I and Q analog signals into $I_d$ and $Q_d$ digital signals;
   an error compensator means receiving said $I_d$ and $Q_d$ digital signals for compensating for differential gain, differential D.C. offset and quadrature phase errors in said I and Q analog signals to produce I''' and Q''' compensated signals,
   said error compensator means compensating for said differential gain, differential offset and phase errors substantially independent of changes in frequency of said analog input carrier signal and without the use of a calibration signal.

21. The apparatus of claim 20, wherein said error compensator means further comprises a digital signal processor computing the long term averages of said $I_d$ and $Q_d$ digital signals individually and using said long term average to compensate for differential DC offset errors in said I and Q analog signal individually.

22. The apparatus of claim 20, wherein said error compensator means further comprises a digital signal processor computing the long term root mean square averages of said I and Q digital signals individually and using said long term root mean square averages to compensate for differential gain errors in said $I_d$ and $Q_d$ analog signal individually.

23. The apparatus of claim 20, wherein said error compensator means further comprises a digital signal processor that Computes a compensation matrix from a sum-of-squares calculation for said $I_d$ and $Q_d$ signals and applies said compensation matrix to said $I_d$ and $Q_d$ signals to correct for quadrature phase errors, said compensation matrix independent from changes in the frequency of said input carrier signal.

24. The apparatus of claim 23, wherein said correction of quadrature phase errors is performed after compensation for said differential D.C. offset and gain errors has been performed on said I and Q signals.

25. The apparatus of claim 20, wherein said error compensation means comprises a digital signal processor and wherein said compensation for said quadrature phase errors is performed in said digital signal processor continuously by calculating a compensation matrix according to stochastic gradient algorithm and applying said compensation matrix mathematically to said $I_d$ and $Q_d$ signals.

26. The apparatus of claim 20, wherein said error compensation means comprises a digital signal processor and wherein said compensation for said quadrature phase errors is performed in said digital signal processor by a) shifting the phase of said $I_d$ and $Q_d$ signals into a 180 degree phase relationship and adding said $I_d$ and $Q_d$ signals to thereby determine the magnitude of the phase error in said I and Q signals, b) using the arcsine of the resultant amplitude error as an argument in a compensation matrix, and c) applying said compensation matrix to said $I_d$ and $Q_d$ signals.

* * * * *